United States Patent
Han et al.

(10) Patent No.: US 7,388,804 B2
(45) Date of Patent: Jun. 17, 2008

(54) SEMICONDUCTOR MEMORY DEVICE FOR DRIVING A WORD LINE

(75) Inventors: Hi-Hyun Han, Kyoungki-do (KR); Chang-Hyuk Lee, Kyoungki-do (KR); Ju-Young Seo, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 134 days.

(21) Appl. No.: 11/478,093

(22) Filed: Jun. 30, 2006

(65) Prior Publication Data

US 2007/0070705 A1    Mar. 29, 2007

(30) Foreign Application Priority Data

Sep. 29, 2005   (KR)   ............... 10-2005-0091692
Dec. 16, 2005   (KR)   ............... 10-2005-0124566

(51) Int. Cl.
*G11C 8/00* (2006.01)
(52) U.S. Cl. .............. 365/230.06; 365/230.03
(58) Field of Classification Search .......... 365/185.11, 365/185.23, 230.03, 230.06, 230.08
See application file for complete search history.

(56) References Cited

U.S. PATENT DOCUMENTS

| 5,602,797 | A | 2/1997 | Kang |
| 5,818,790 | A | 10/1998 | Kim et al. |
| 5,862,098 | A | 1/1999 | Jeong |
| 6,069,838 | A | 5/2000 | Jeong |
| 7,027,351 | B2* | 4/2006 | Lee et al. ............ 365/230.06 |
| 7,177,209 | B2* | 2/2007 | Choi .................... 365/200 |
| 2002/0163843 | A1 | 11/2002 | Sim et al. |
| 2005/0083752 | A1 | 4/2005 | Lee et al. |

* cited by examiner

*Primary Examiner*—VanThu Nguyen
(74) *Attorney, Agent, or Firm*—McDermott Will & Emery LLP

(57) ABSTRACT

A semiconductor memory device for driving a word line is provided. The enabling timing of a word line is advanced using a block information signal that contains no redundancy information, thereby improving a RAS to CAS delay (tRCD). A sub word line driving enable signal for controlling a driving of a sub word line and a main word line driving enable signal for controlling a driving of a main word line are controlled by the block information signal that contains only mat information but does not contain the redundancy information. Accordingly, the word line control signal may be activated earlier than the sub word line driving enable signal and the main word line driving enable signal, thereby advancing the enable timing of the word line.

13 Claims, 7 Drawing Sheets

US 7,388,804 B2

SEMICONDUCTOR MEMORY DEVICE FOR DRIVING A WORD LINE

FIELD OF THE INVENTION

The present invention relates to a semiconductor memory device; and, more particularly, to a semiconductor memory device for driving a word line for improving an RAS to CAS delay (tRCD) by advancing an enable timing of a word line.

DESCRIPTION OF RELATED ARTS

Generally, a dynamic random access memory (DRAM) requires an address and a fuse box so as to drive word lines. Address delays can occur in determining whether a normal word line or a redundant word line will be enabled.

If there is no fuse box, a sub wordline address LAX<0:7> for driving sub word lines and a main wordline address LAX<8:71> for driving main word lines can reach their respective mats (MAT) without time delay and are decoded to enable the word lines. The mats (MAT) mean a plurality of cell matrix regions, each being formed by a bit line and a bit line bar for making a voltage difference.

However, since the DRAM uses the redundancy, the fuse box is required. The delay time inevitably occurs in determining which one of the normal word line and the redundant word line will be enabled.

FIG. 1 is a circuit diagram of a control signal generator 10 of the related arts. Control signal generator 10 includes a plurality of inverters IV1 to IV4 and a plurality of NAND gates ND1 to ND3.

The first NAND gate ND1 performs a NAND operation on addresses LAX9A and LAXBC. The second inverter IV2 inverts an output of the first NAND gate ND1. The first inverter IV1 inverts a normal word line enable signal NXEB. The second NAND gate ND2 performs a NAND operation on an output of the first inverter IV1 and an output of the second inverter IV2. The third NAND gate ND3 performs a NAND operation on a redundant enable signal XHITB and an output of the NAND gate ND2. The third inverter IV3 inverts an output of the third NAND gate ND3 to output a block select signal BSB. The fourth inverter IV4 inverts the output of the second NAND gate ND2 to output a normal word line control signal NXEN.

FIG. 2 is a circuit diagram of a driving controller 20 of the related arts. The driving controller 20 includes a plurality of inverters IV5 to IV16, a plurality of NAND gates ND4 to ND7, PMOS transistors P1 and P2, and NMOS transistors N1 and N2.

Each of fifth and sixth inverters IV5 and IV6 inverts the block select signal BSB and a second active control signal R2ACB, respectively. The fourth NAND gate ND4 performs a NAND operation on an output of the fifth inverter IV5 and an output of the sixth inverter IV6.

The first PMOS transistor P1 and the first NMOS transistor N1 are connected in series between a pumping voltage (VPP) terminal and a ground voltage (VSS) terminal. The second PMOS transistor P2 and the second NMOS transistor N2 are connected in series between the VPP terminal and the VSS terminal. Gates of the first and second PMOS transistors P1 and P2 are cross-coupled. The first NMOS transistor N1 has a gate receiving an output of the seventh inverter IV7, and the second NMOS transistor N2 has a gate receiving an output of the eighth inverter IV8.

The ninth and tenth inverters IV9 and IV10 delay an output of a node A in a non-inverting way to output a word line control signal WLOFFB. The eleventh inverter IV11 inverts a first active control signal R1ACB. The fifth NAND gate ND5 performs a NAND operation on an output of the eleventh inverter IV11 and the normal word line control signal NXEN. The twelfth and thirteenth inverters IV12 and IV13 delay the output of the eleventh inverter IV11 in a non-inverting way. The eleventh inverter IV11 inverts the first active control signal R1ACB.

The sixth NAND gate ND6 performs a NAND operation on the signal of the node A and an output of the inverter IV13. The fifteenth inverter IV15 inverts an output of the sixth NAND gate ND6 to output a driving enable signal XDEC_EN. The fourteenth inverter IV14 inverts an output of the fifth NAND gate ND5. The seventh NAND ND7 performs a NAND operation on the signal of the node A and an output of the fourteenth inverter IV14. The sixteenth inverter IV16 inverts an output of the seventh NAND gate ND7 to output a main word line driving enable signal MWD_EN.

In the word line driver of the related arts, the timing of enabling the word line is determined by how fast the driving enable signal XDEC_EN and the main word line driving enable signal MWD_EN are enabled.

That is, the driving enable signal XDEC_EN and the main word line driving enable signal MWD_EN are controlled by the voltage level of the node A. At this point, by controlling the driving enable signal XDEC_EN and the main word line driving enable signal MWD_EN according to the voltage level of the node A, the word line address LAX<0:7> or LAX<8:71> are activated later than the word line control signal WLOFFB. Therefore, signal collision between the main word line driver and the sub word line driver can be prevented.

The voltage level of the node A is determined by the block select signal BSB. The block select signal BSB is controlled by the normal word line enable signal NXEB for deactivating the normal word line during a redundancy operation, the redundant enable signal XHITB for enabling the corresponding redundant line, and the addresses LAX9A and LAXBC containing mat information. Therefore, to replace the normal word line, the redundancy disposed at other mats can be flexibly used.

In the word line driver of the related arts, however, the normal word line enable signal NXEB is enabled later than the addresses LAX9A and LAXBC. Therefore, the block select signal BSB is enabled late and the voltage level of the node A is changed late. In this case, since the driving enable signal XDEC_EN and the word line driving enable signal MWD_EN are enabled late, the enabling time of the word line is delayed.

SUMMARY OF THE INVENTION

It is, therefore, an object of the present invention to provide a semiconductor memory device for driving a word line that may improve an RAS to CAS delay (tRCD) by advancing enable timing of a word line using a block signal having no redundancy information.

In accordance with an aspect of the present invention, a semiconductor memory device for driving a word line includes: a control signal generator for generating a block information signal by logically combining first and second addresses containing mat information, and outputting a normal word line control signal activated during an active operation by logically combining the block information signal and a normal word line enable signal; a driving control signal generator for generating a word line control signal by logically combining the block information signal, a first active control signal, and a redundant enable signal; a driving enable signal generator for generating a main word line driving enable signal and a sub word line driving enable signal by logically combining the normal word line control signal and a second active control signal which does not contain redundancy information; and a main/sub word line driving controller for generating a main word line driving signal by combining the main word line driving enable signal and addresses for driving the main word lines, and generating a sub word line driving signal by combining the sub word line driving enable signal and addresses for driving the sub word lines, when the word line control signal is activated.

In accordance with another aspect of the present invention, a semiconductor memory device for driving a word line includes: a fuse box for receiving a row address and outputting a normal word line enable signal and a redundant enable signal; a plurality of mats, each for receiving the normal word line enable signal, the redundant enable signal, a sub word line address for driving the sub word lines, a main word line address for driving the main word lines and first and second addresses containing mat information, and outputting a main word line driving signal and a sub word line driving signal; and a sub word line driver for controlling the driving of the sub word lines based on the main word line driving signal and the sub word line driving signal.

DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A semiconductor memory device for driving a word line in accordance with exemplary embodiments of the present invention will be described in detail with reference to the accompanying drawings.

Figure 1:
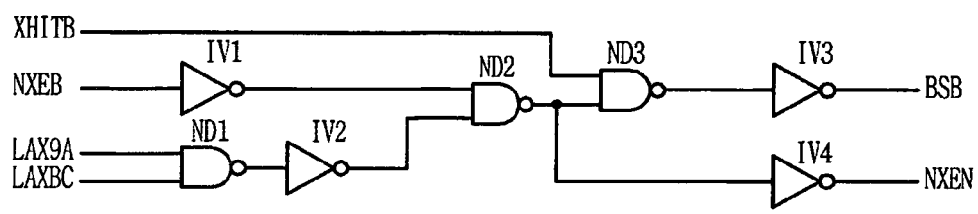
FIG. 1 is a circuit diagram of a control signal generator of the related arts.
Figure 2:
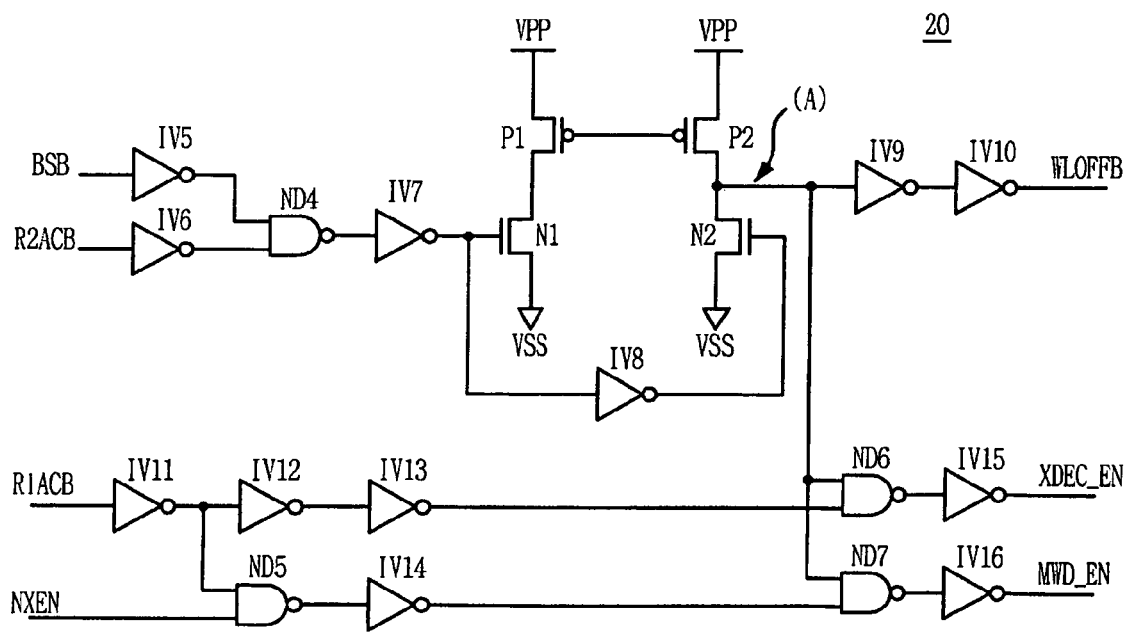
FIG. 2 is a circuit diagram of a driving controller of the related arts.
Figure 3:
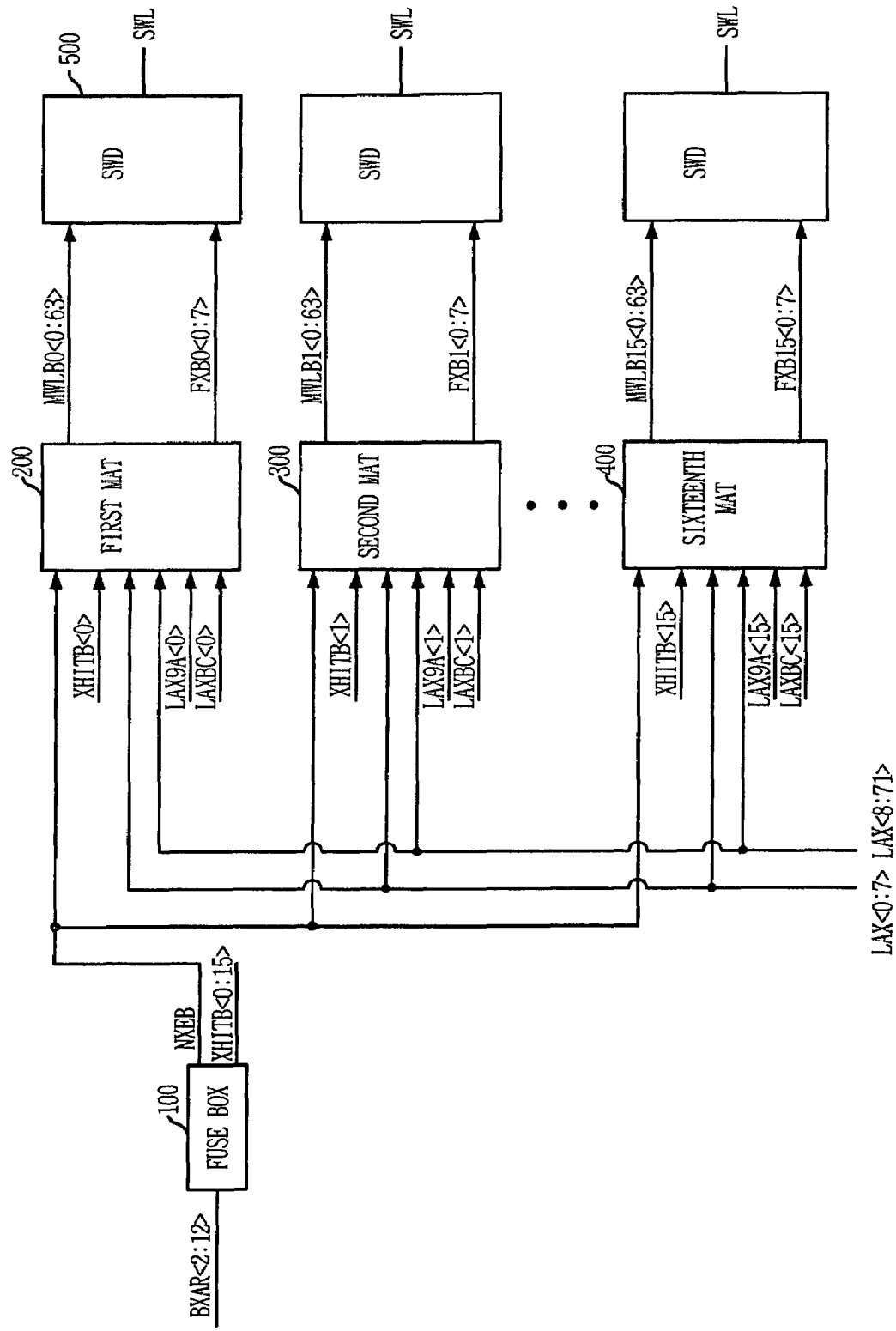
FIG. 3 is a block diagram of a word line driver in accordance with an embodiment of the present invention.

FIG. 3 is a block diagram of a word line driver in accordance with an embodiment of the present invention.

Referring to FIG. 3, the word line driver includes a fuse box 100, a plurality of mats 200 to 400, and a plurality of sub word line driver circuits 500.

The fuse box 100 receives row addresses BXAR<2:12> to output a normal word line enable signal NXEB and a redundant enable signal group XHITB<0:15>. The fuse box 100 is provided with sixteen sub fuse boxes.

The first mat 200 receives the normal word line enable signal NXEB, a first redundant enable signal XHITB<0> of the redundant enable signal group XHITB<0:15>, a sub word line address LAX<0:7> for driving the sub word lines, a main word line address LAX<8:71> for driving the main word lines, and addresses LAX9A<0> and LAXBC<0> containing mat information and outputs main word line driving signals MWLB<0:63> and sub word line driving signals FXBO<0:7>.

The other mats 300 and 400 include sixteen mats receiving a corresponding redundant enable signal of the redundant enable signals XHITB<1:15>. Since each of the mats 300 and 400 has the same construction as that of the first mat 200, a detailed description thereof will be omitted.

The sub word line driver circuits 500 control the driving of the sub word lines SWL based on the main word line driving signals MWLB<0:63> and the sub word line driving signals FXB0<0:7>.

Each of the mats 200 to 400 includes a control signal generator, a driving signal generator, and a main/sub word line driving controller.

Hereinafter, a detailed circuit diagram of the first mat 200 will be described.

Figure 4:
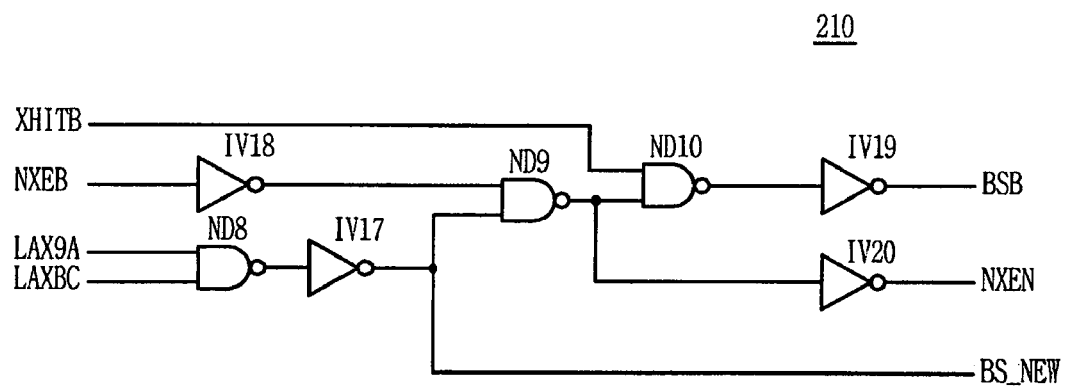
FIG. 4 is a circuit diagram of a control signal generator of the word line driver illustrated in FIG. 3.

FIG. 4 is a circuit diagram of the control signal generator 210 of the word line driver 200 illustrated in FIG. 3.

Referring to FIG. 4, the control signal generator 210 includes a plurality of inverters IV17 to IV20 and a plurality of NAND gates ND8 to ND10.

The first NAND gate ND8 performs a NAND operation on the addresses LAX9A and LAXBC. The first inverter IV17 inverts an output of the first NAND gate ND8 to output a block information signal BS_NEW. The second inverter IV18 inverts the normal word line enable signal NXEB. The second NAND gate ND9 performs a NAND operation on an output of first inverter IV17 and an output of the second inverter IV18. The third NAND gate ND10 performs a NAND operation on the redundant enable signal XHITB and an output of the second NAND gate ND9. The third inverter IV19 inverts an output of the third NAND gate ND10 to output the block select signal BSB. The fourth inverter IV20 inverts the output of the second NAND gate ND9 to output. the normal word line control signal NXEN.

Figure 5:
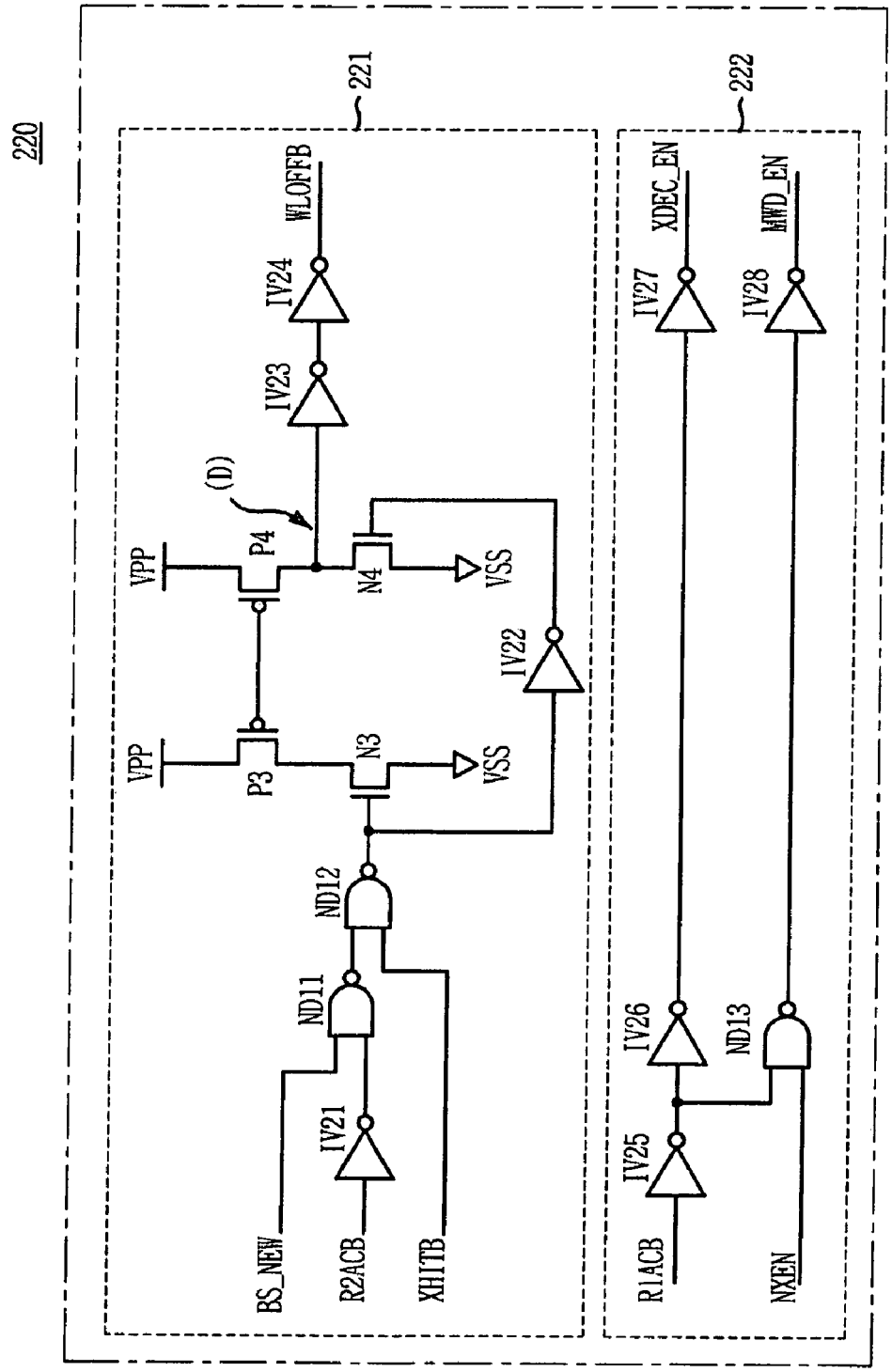
FIG. 5 is a circuit diagram of a driving signal generator of the word line driver illustrated in FIG. 3.

FIG. 5 is a circuit diagram of the driving signal generator 220 of the word line driver 200 illustrated in FIG. 3.

The driving signal generator 220 includes a driving control signal generating unit 221 and a driving enable signal generating unit 222.

The driving control signal generating unit 221 includes a plurality of inverters IV21 to IV24, a plurality of NAND gates ND11 and ND12, first and second PMOS transistors P3 and P4, and first and second NMOS transistors N3 and N4.

The first inverter IV21 inverts a second active control signal R2ACB. The first NAND gate ND11 performs a NAND operation on the block information signal BS_NEW and an output of the first inverter IV21. The second NAND gate ND12 performs a NAND operation on the redundant enable signal XHITB and an output of the first NAND gate ND11.

The first PMOS transistor P3 and the first NMOS transistor N3 are connected in series between a pumping voltage (VPP) terminal and a ground voltage (VSS) terminal. The second PMOS transistor P4 and the second NMOS transistor N4 are connected in series between the VPP terminal and the VSS terminal. Gates of the first and second PMOS transistors P3 and P4 are cross-coupled. The first NMOS transistor N3 has a gate receiving an output of the second NAND gate ND12, and the second NMOS transistor N4 has a gate receiving an output of the second inverter IV22 which inverts the output of the second NAND gate ND12. The third and fourth inverters IV23 and IV24 delay a signal at a node D in a non-inverting way to output a word line control signal WLOFFB.

The driving enable signal generating unit 222 includes a plurality of inverters IV25 to IV28 and a NAND gate ND13.

The fifth inverter IV25 inverts a first active control signal R1ACB. The third NAND gate ND13 performs a NAND operation on an output of the fifth inverter IV25 and the normal word line control signal NXEN. The sixth and seventh inverters IV26 and IV27 delay an output of the fifth inverter IV25 in a non-inverting way to output a driving enable signal XDEC_EN. The eighth inverter IV28 inverts an output of the third NAND gate ND13 to output a main word line driving enable signal MWD_EN.

Figure 6:
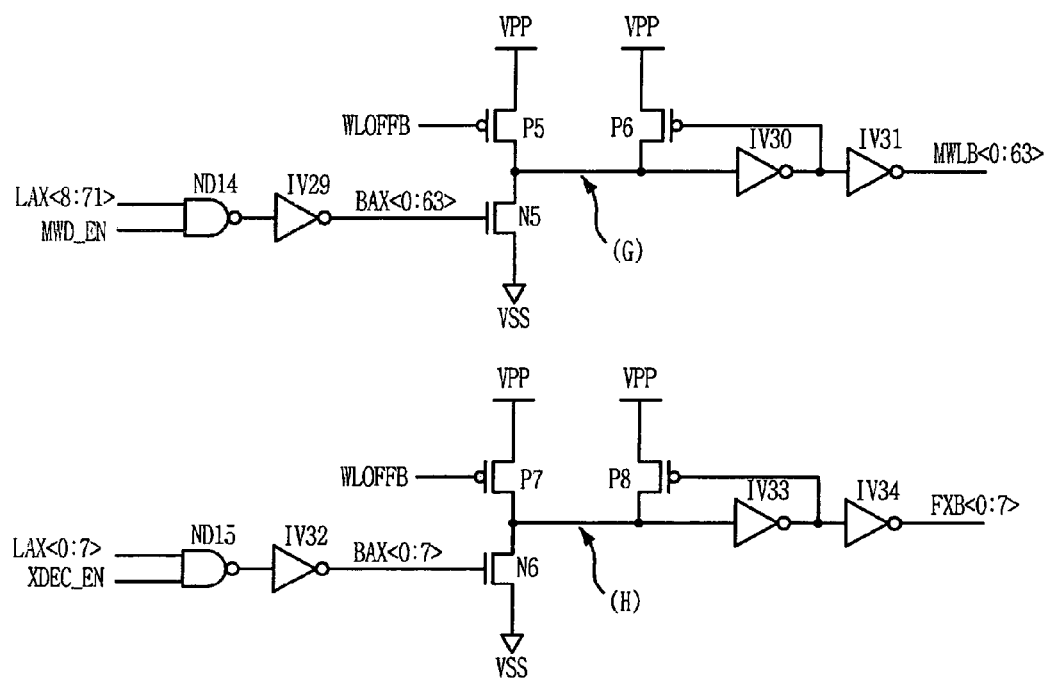
FIG. 6 is a circuit diagram of a main/sub word line driving controller of the word line driver illustrating in FIG. 3.

FIG. 6 is a circuit diagram of the main/sub word line driving controller 230 of the word line driver 200 illustrated in FIG. 3.

Referring to FIG. 6, the main/sub word line driving controller 230 includes first and second NAND gates ND14 and ND15, a plurality of inverters IV29 to IV34, a plurality of PMOS transistors P5 to P8, and first and second NMOS transistors N5 and N6.

The first NAND gate ND14 performs a NAND operation on the main word line address LAX<8:71> and the main word line driving enable signal MWD_EN. The first inverter IV29 inverts an output of the first NAND gate ND14 to output an intermediate address BAX<0:63>.

The first PMOS transistor P5 and the first NMOS transistor N5 are connected in series between the VPP terminal and the VSS terminal. The first PMOS transistor P5 has a gate receiving the word line control signal WLOFFB and the first NMOS transistor N5 has a gate receiving the intermediate main word line address BAX<0:63>. The second PMOS transistor P6 is connected between the VPP terminal and a node G. The second PMOS transistor P6 has a gate receiving an output of the second inverter IV30 which receives and inverts a signal at the node G. The third inverter IV31 inverts the output of the second inverter IV30 to output the main word line driving signals MWLB<0:63>.

The second NAND gate ND15 performs a NAND operation on the sub word line address LAX<0:7> and the driving enable signal XDEC_EN. The fourth inverter IV32 inverts an output of the second NAND gate ND15 to output an intermediate sub word line address BAX<0:7>.

The third PMOS transistor P7 and the second NMOS transistor N6 are connected in series between the VPP terminal and the VSS terminal. The third PMOS transistor P7 has a gate receiving the word line control signal WLOFFB, and the second NMOS transistor N6 has a gate receiving the intermediate sub word line address BAX<0:7>. The fourth PMOS transistor P8 is connected between the VPP terminal and a node H. The PMOS transistor P8 has a gate receiving an output of the fifth inverter IV33 which inverts a signal at node H. The sixth inverter IV34 inverts an output of the fifth inverter IV33 to output the sub word line driving signal FXB<0:7>.

Figure 7:
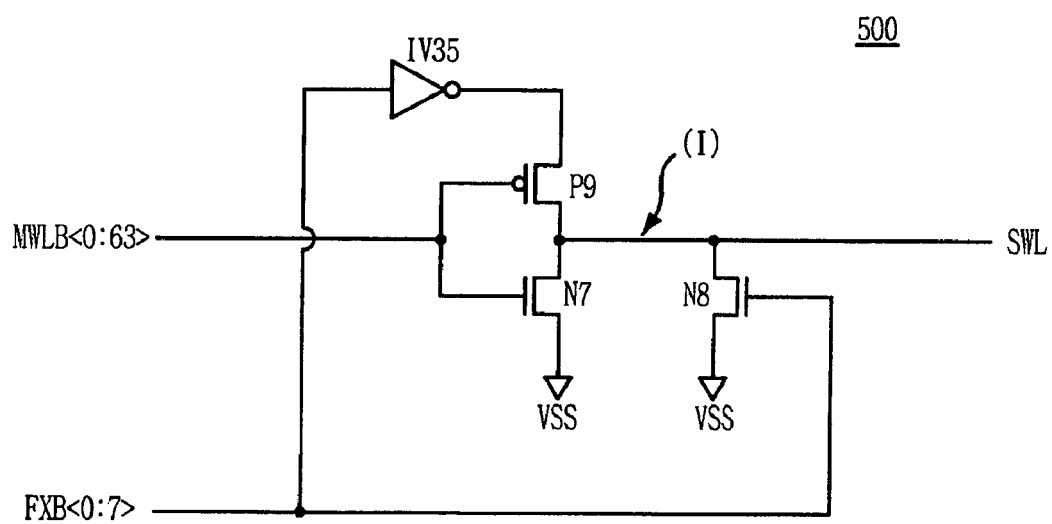
FIG. 7 is a circuit diagram of a sub word line driver circuit shown in FIG. 3.

FIG. 7 is a circuit diagram of the sub word line driver circuit 500 shown in FIG. 3.

The sub word line driver circuit 500 includes an inverter IV35, a PMOS transistor P9, first and second NMOS transistors N7 and N8.

The inverter IV35 inverts the sub word line driving signals FXB<0:7>. The PMOS transistor P9 and the first NMOS transistor N7 are connected in series between an output terminal of the inverter IV35 and the VSS terminal. A gate of the PMOS transistor P9 and a gate of the first NMOS transistor N7 are commonly connected and receive the main word line driving signals MWLB<0:63>. The second NMOS transistor N8 is connected between a node I and the VSS terminal. The second NMOS transistor N8 has a gate receiving the sub word line driving signal FXB<0:7>.

Operation of the word line driver in accordance with the present invention will be described below with reference to FIG. 8.

Figure 8:
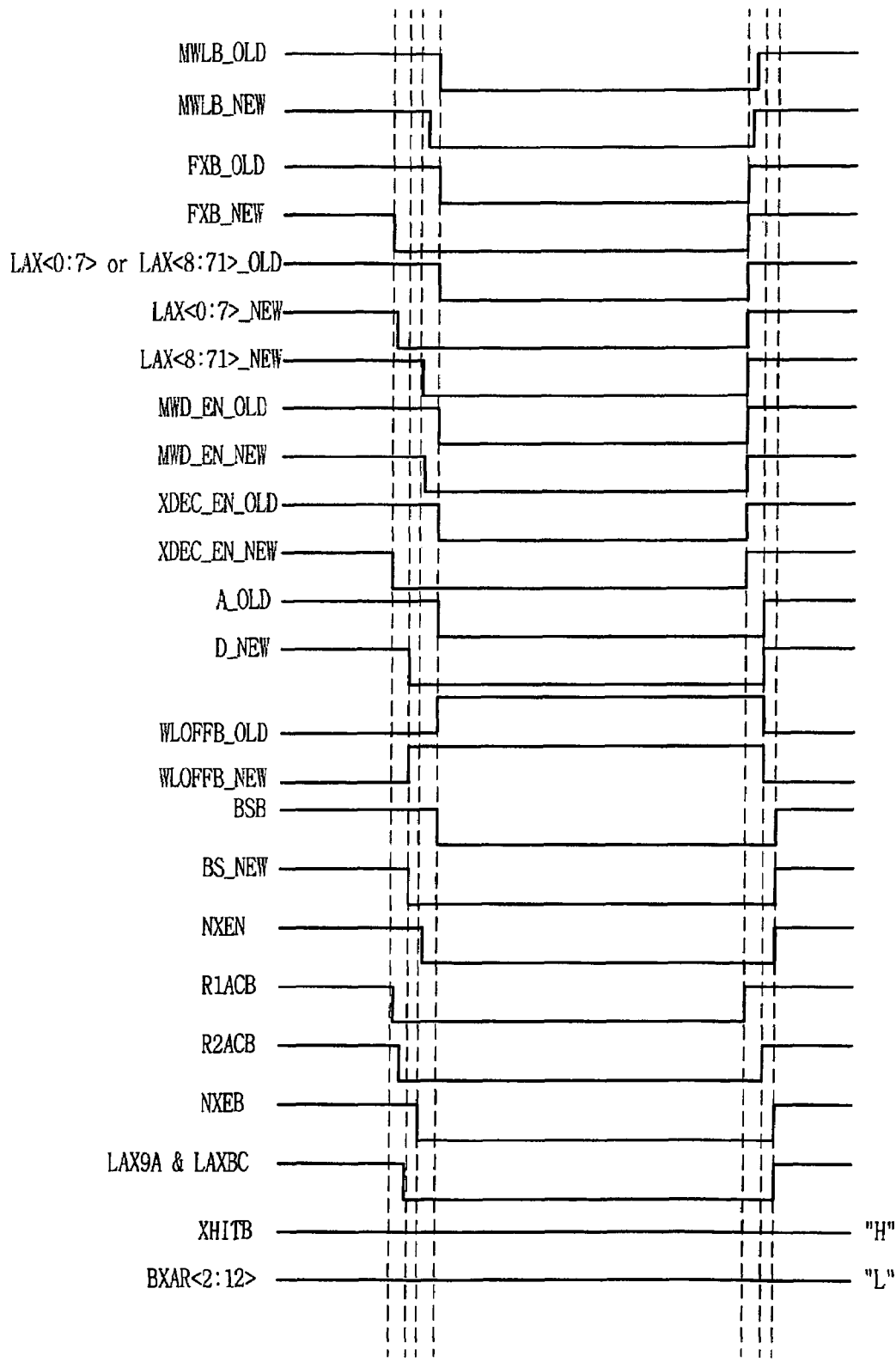
FIG. 8 is a timing diagram for the signals used in the word line driver in accordance with the present invention.

FIG. 8 is a timing diagram illustrating the signals used in the word line driver in accordance with the present invention. In FIG. 8, the term "old" corresponds to the related arts arrangement and the term "new" corresponds to the claimed invention.

The fuse box 100 selectively outputs the normal word line enable signal NXEB and the redundant enable signal group XHITB<0:15> according to the row address BXAR<2:12>. That is, which one of the normal word line and the redundant word line that will be enabled is determined according to the cutting of sixteen fuses in the fuse box 100, and the normal word line enable signal NXEB or the redundant enable signal group XHITB<0:15> is output.

The first mat 200 among the mats 200 to 400 receives the normal word line enable signal NXEB, the first redundant enable signal XHITB<0> of the redundant enable signal group XHITB<0:15>, the sub word line address LAX<0:7>, the main word line address LAX<8:71>, and the addresses LAX9A<0> and LAXBC<0> and outputs the main word line driving signals MWLB<0:63> and the sub word line driving signals FXBO<0:7>.

The control signal generator 210 generates the block information signal BS_NEW by NANDing the addresses LAX9A and LAXBC that contain only mat information but do not contain the redundant information, without regard to the normal word line enable signal NXEB and the redundant enable signal XHITB.

The driving signal generator 220 outputs the word line control signal WLOFFB by logically combining the block information signal BS_NEW, the second active control signal R2ACB, and the redundant enable signal XHITB activated during a redundant operation.

In this case, when the redundant word line is activated, the word line control signal WLOFFB for controlling the normal word line is also activated. That is, when the redundant word lines of different mats are enabled, the word line control signal WLOFFB corresponding to the original mat is also enabled. However, since the main word line driving enable signal MWD_EN maintains a disabled state, the activation of the normal word line causes no problems in the logic.

The driving enable signal XDEC_EN and the main word line enable signal MWD_EN are generated by logically combining the first active control signal R1ACB and the normal word line control signal NXEN, which do not contain the redundancy information. That is, the driving enable signal XDEC_EN is controlled according to the first active control signal R1ACB. The main word line driving enable signal MWD_EN is controlled according to the normal word line control signal NXEN and the first active control signal R1ACB, which are activated during an active operation and a precharge operation, respectively.

Therefore, the word line control signal WLOFFB is activated earlier than the driving enable signal XDEC_EN and the main word line driving enable signal MWD_EN. Consequently, the driving signal generator 220 may advance the enabling of the word line by activating the driving enable signal XDEC_EN and the main word line driving enable signal MWD_EN, and the word line control signal WLOFFB early.

The main/sub word line driving controller 230 logically combines the main word line address LAX<8:71> and the sub word line address LAX<0:7>, the driving enable signal XDEC_EN, and the main word line driving enable signal MWD_EN, and outputs the main word line driving signals MWLB<0:63> and the sub word line driving signals FXB<0:7> according to the word line control signal WLOFFB. Accordingly, the enabling timing of the word line may be advanced by about 500 ps compared with the related arts.

As described above, the enabling timing of the word line may be advanced by controlling the sub word line driver and the main word line driver according to the redundant enable signal and the block information signal that contains only the block information but does not contain the redundancy information, thereby improving the RAS to CAS delay (tRCD).

The present application contains subject matter related to Korean patent application Nos. 2005-91692 & 2005-124566, filed in the Korean Intellectual Property Office on Sep. 29, 2005 & Dec. 16, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device for driving a word line, comprising:
    a control signal generator for generating a block information signal by logically combining first and second addresses containing mat information, and outputting a normal word line control signal activated during an active operation by logically combining the block information signal and a normal word line enable signal;
    a driving control signal generator for generating a word line control signal by logically combining the block information signal, a first active control signal, and a redundant enable signal;
    a driving enable signal generator for generating a main word line driving enable signal and a sub word line driving enable signal by logically combining the normal word line control signal and a second active control signal which does not contain redundancy information; and
    a main/sub word line driving controller for generating a main word line driving signal by combining the main word line driving enable signal and addresses for driving the main word lines, and generating a sub word line driving signal by combining the sub word line driving enable signal and addresses for driving the sub word lines, when the word line control signal is activated.

2. The semiconductor memory device as recited in claim 1, wherein the word line control signal is activated earlier than the sub word line driving enable signal and the main word line driving enable signal.

3. The semiconductor memory device as recited in claim 1, wherein the main word line driving enable signal maintains a disable state when a redundant word line is activated in response to the redundant enable signal.

4. The semiconductor memory device as recited in claim 1, wherein the second active control signal is activated during a precharge operation.

5. The semiconductor memory device as recited in claim 1, wherein the control signal generator includes:
    a first logic operation unit for generating the block information signal by logically combining the first and second addresses; and
    a second logic operation unit for generating the normal word line control signal by logically combining the block information signal and the normal word line enable signal.

6. The semiconductor memory device as recited in claim 5, wherein the first logic operation unit includes:
    a first NAND gate for NANDing the first and second addresses; and
    a first inverter for inverting an output of the first NAND gate to output the block information signal.

7. The semiconductor memory device as recited in claim 5, wherein the second logic operation unit includes:
    a second inverter for inverting the normal word line enable signal;
    a second NAND gate for NANDing an output of the second inverter and the block information signal; and
    a third inverter for inverting an output of the second NAND gate to output the normal word line control signal.

8. The semiconductor memory device as recited in claim 1, wherein the driving control signal generator includes:
    a logic operation unit for logically combining the block information signal, the first active control signal, and the redundant enable signal;
    a driving unit for selectively controlling a voltage level of a first node according to an output of the third logic operation unit; and
    a first delay unit for delaying a signal of the first node by a predetermined time to output the word line control signal.

9. The semiconductor memory device as recited in claim 8, wherein the logic operation unit includes:
    an inverter for inverting the first active control signal;
    a first NAND gate for NANDing an output of the inverter and the block information signal; and
    a second NAND gate for NANDing an output of the first NAND gate and the redundant enable signal.

10. The semiconductor memory device as recited in claim 9, wherein the driving unit includes:
    a first PMOS transistor and a first NMOS transistor connected in series between a pumping voltage terminal and a ground voltage terminal;
    a second inverter for inverting an output of the second NAND gate; and
    a second PMOS transistor and a second NMOS transistor connected in series between the pumping voltage terminal and the ground voltage terminal, including drains coupled to the first node in common,
    wherein gates of the first and second PMOS transistors are cross-coupled, the first NMOS transistor has a gate receiving the output of the fourth NAND gate, and the second NMOS transistor has a gate receiving an output of the fifth inverter.

11. The semiconductor memory device as recited in claim 8, wherein the first delay unit includes an even number of inverters.

12. The semiconductor memory device as recited in claim 1, wherein the driving enable signal generator includes:
    a delay unit for delaying the second active control signal by a predetermined time to output the sub word line driving enable signal; and a logic operation unit for generating the main word line driving enable signal by logically combining the second active control signal and the normal word line control signal.

13. The semiconductor memory device as recited in claim 12, wherein the logic operation unit includes:

a NAND gate for NANDing the normal word line control signal and an inverted second active control signal; and
an inverter for inverting an output of the NAND gate to output the main word line driving enable signal.

* * * * *